(12) United States Patent
Torii et al.

(10) Patent No.: US 6,567,312 B1
(45) Date of Patent: May 20, 2003

(54) NON-VOLATILE SEMICONDUCTOR MEMORY DEVICE HAVING A CHARGE STORING INSULATION FILM AND DATA HOLDING METHOD THEREFOR

(75) Inventors: Satoshi Torii, Kuwana (JP); Hideyuki Kojima, Kuwana (JP); Hiroshi Mawatari, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/689,714

(22) Filed: Oct. 13, 2000

(30) Foreign Application Priority Data

May 15, 2000 (JP) ........................................ 2000-141072

(51) Int. Cl.[7] .............................................. G11C 16/04
(52) U.S. Cl. ............................ 365/185.28; 365/185.19; 365/185.22; 365/185.29
(58) Field of Search ........................ 365/185.28, 185.29, 365/185.19, 185.22, 185.01

(56) References Cited

U.S. PATENT DOCUMENTS

| | | | | | |
|---|---|---|---|---|---|
| 5,319,230 A | * | 6/1994 | Nakao | ........................ | 257/325 |
| 5,621,687 A | * | 4/1997 | Doller | .................... | 365/185.22 |
| 5,789,776 A | * | 8/1998 | Lancaster | .................... | 257/296 |
| 5,831,905 A | * | 11/1998 | Hirano | .................. | 365/185.29 |
| 6,137,718 A | * | 10/2000 | Reisinger | ............... | 365/185.03 |
| 6,163,048 A | * | 12/2000 | Hirose et al. | ............... | 257/315 |

* cited by examiner

*Primary Examiner*—Hoai Ho
(74) *Attorney, Agent, or Firm*—Arent Fox Kintner Plotkin & Kahn

(57) ABSTRACT

In a flash memory having, for example, a single-gate type memory cell consisting of the gate electrode provided via a thin charge trap layer on a semiconductor substrate, there is provided a non-volatile semiconductor memory that is characterized in applying a short pulse to the memory cell to partly remove the electrons from the charge trap layer after writing the data to the memory cell. This ensures the write operation reliability of non-volatile semiconductor memory such as single-gate type flash memory or the like without changing the basic structure of the memory cell array.

20 Claims, 14 Drawing Sheets

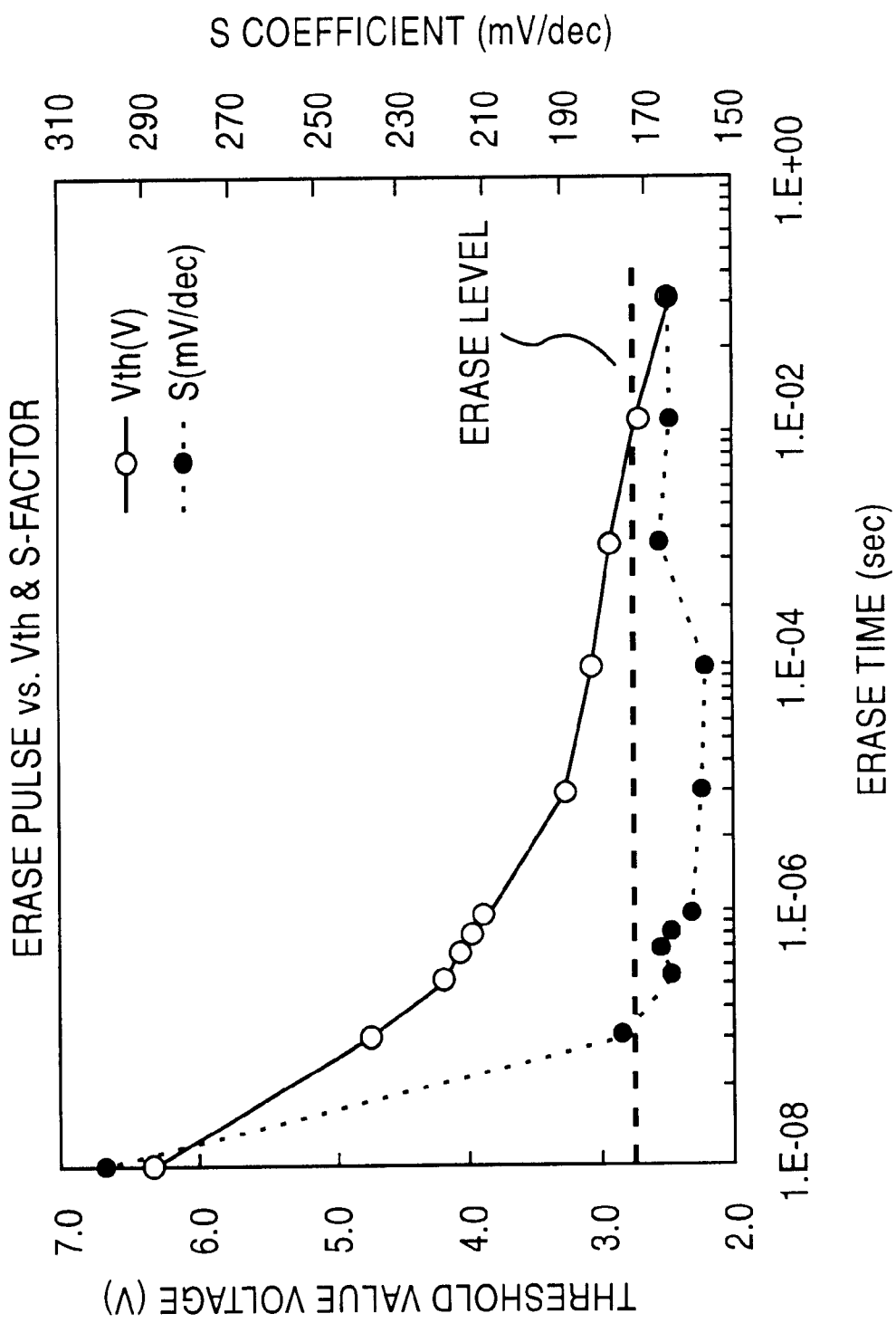

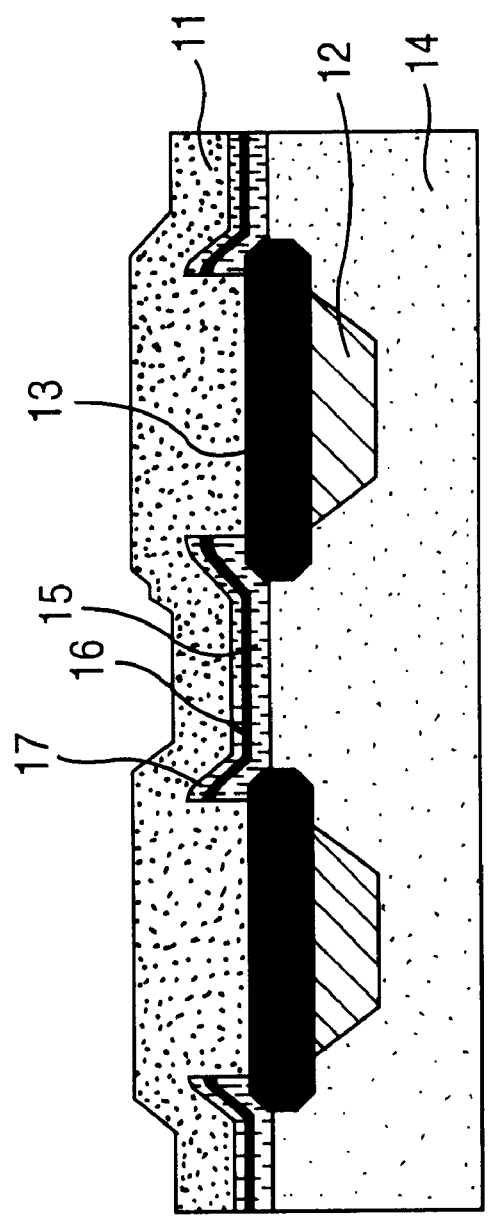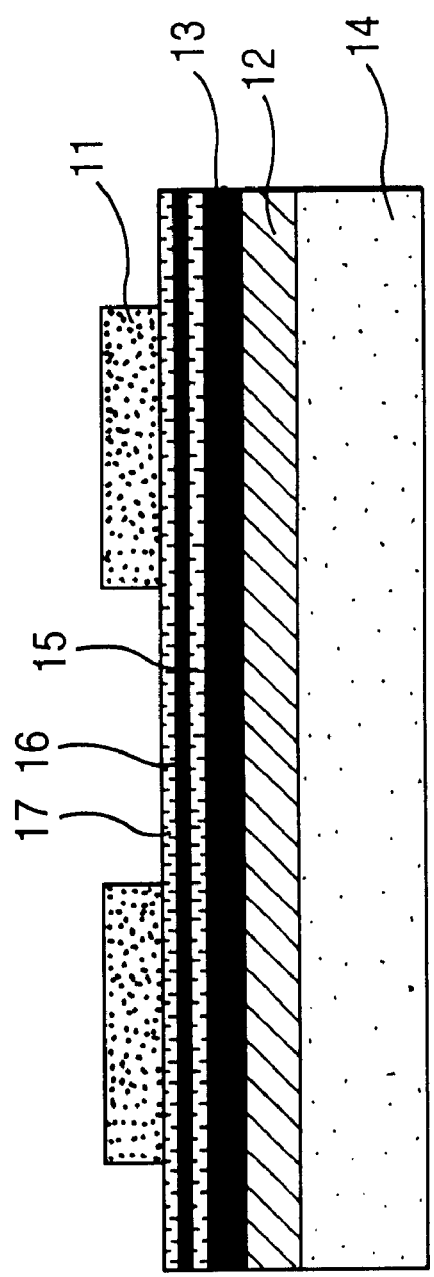
FIG.8(a)
FIG.8(b)

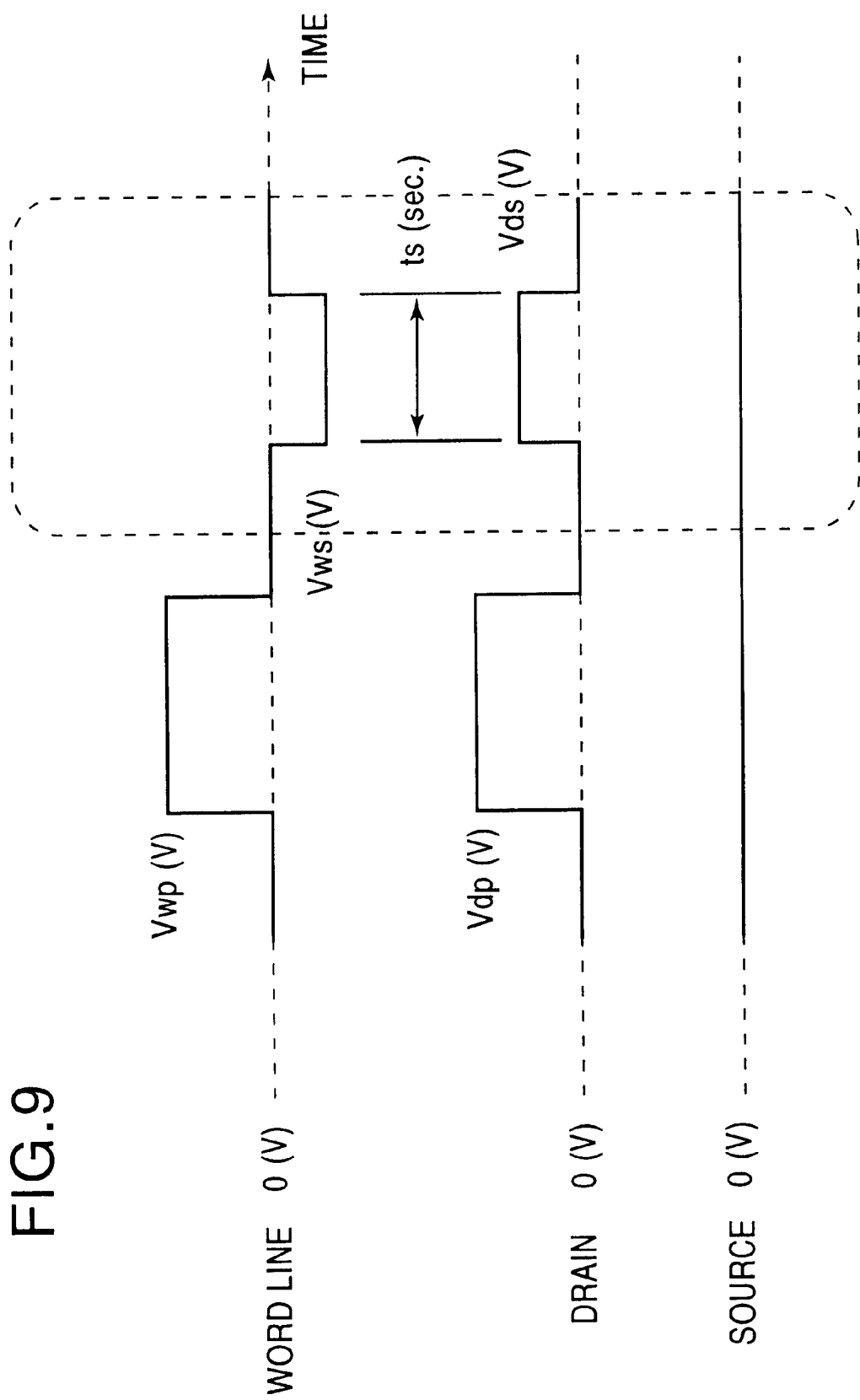

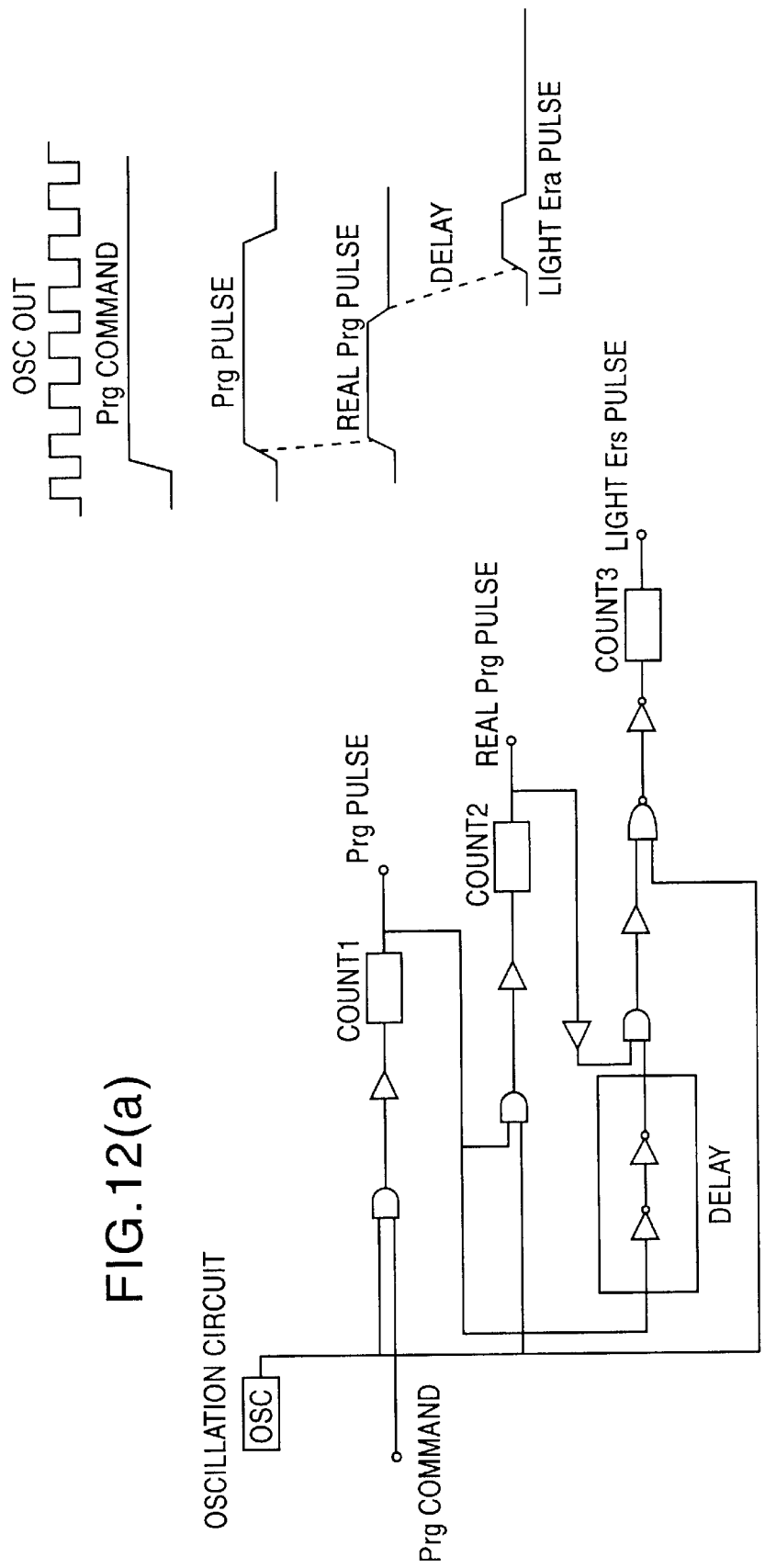

HIGH VOLTAGE SWITCH CIRCUIT

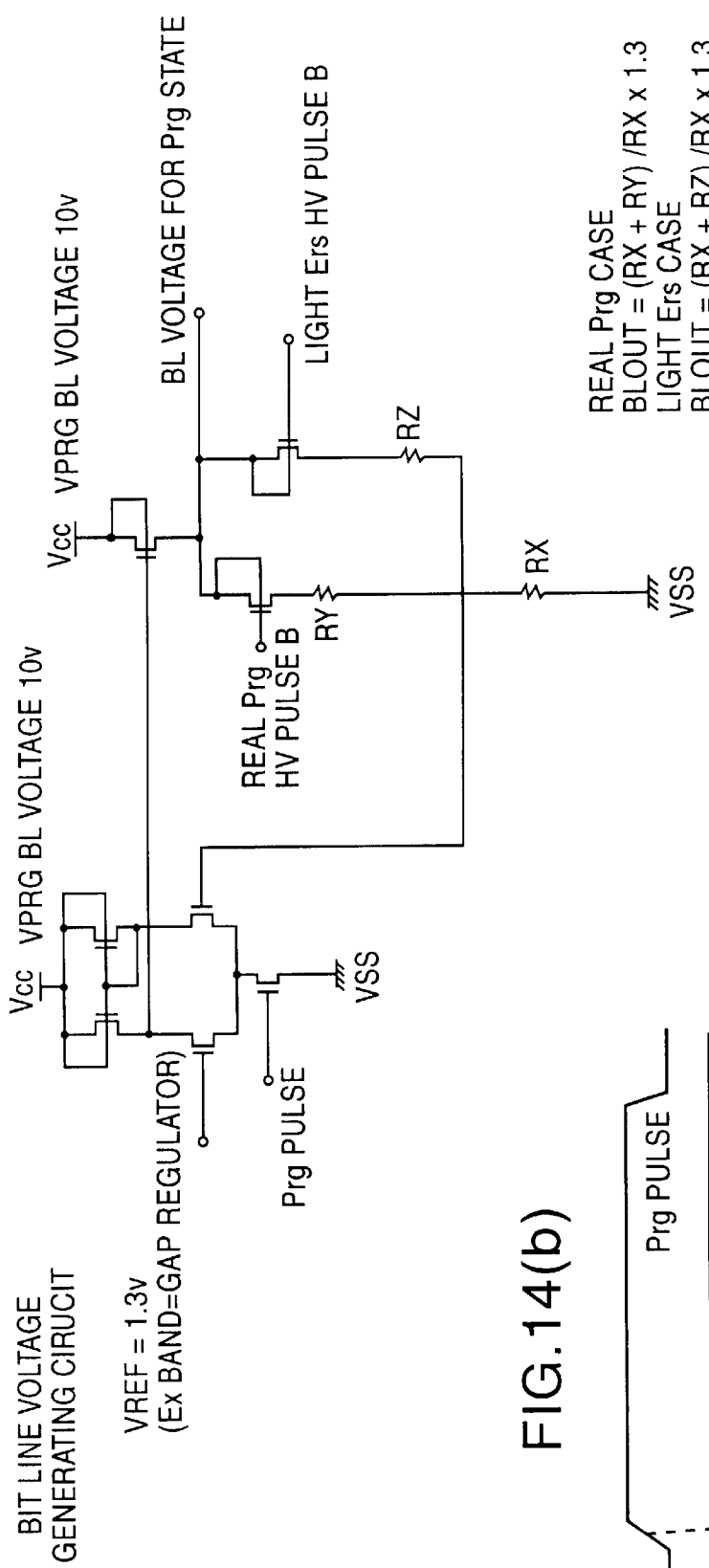
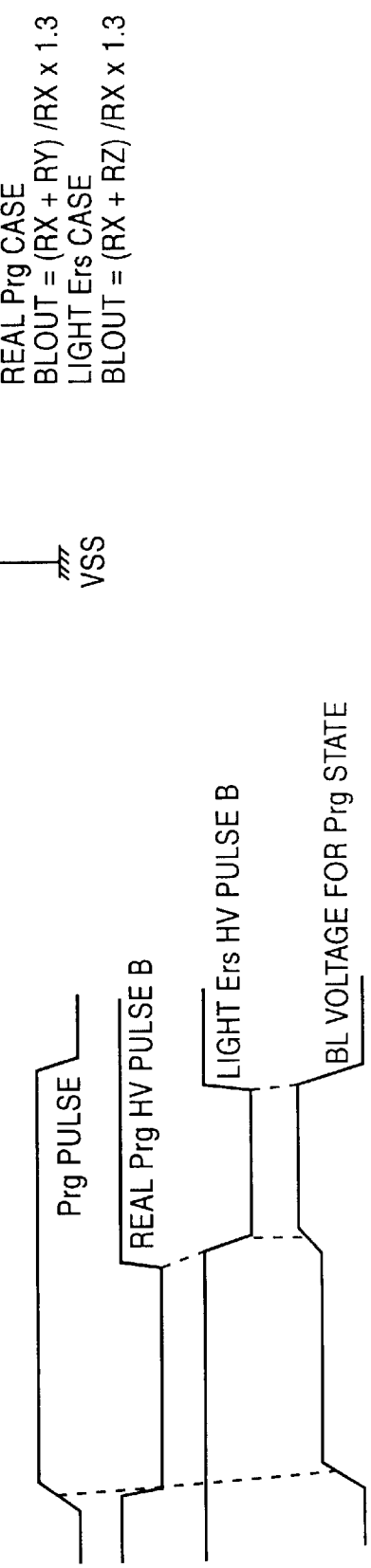
FIG. 14(a) BIT LINE VOLTAGE GENERATING CIRCUIT
FIG. 14(b)

WORD LINE VOLTAGE
GENERATING CIRCUIT

NON-VOLATILE SEMICONDUCTOR MEMORY DEVICE HAVING A CHARGE STORING INSULATION FILM AND DATA HOLDING METHOD THEREFOR

CROSS-REFERENCE TO RELATED APPLICATION

This application is based upon and claims priority of Japanese Patent Application No. 2000-141072, filed, the contents being incorporated herein by reference.

BACKGROUND OF THE INVENTION

1. Field of the Invention

The present invention relates to a technique for improving data holding of a non-volatile memory such as EEPROM (Electrical Erasable and Programmable Read Only Memory) and flash memory (an EEPROM capable of simultaneously erasing plural memory data in a memory cell block by one action). In more detail, the present invention relates to improvement of technique for making data reading characteristic more reliable by prohibiting memory data from easily deteriorating once after the data is stored into EEPROM memory cell, e.g., flash memory cell.

2. Discussion of the Related Art

A memory cell used in the non-volatile memory such as EEPROM and flash memory has generally been formed, according to the related art, with a double-gate structure including a floating gate electrode and a control gate electrode, provided in the laminating method holding a thin insulation film between these gate electrodes. However, recently the complicated manufacturing process of such double-gate structure distinctively impedes ultra-micro-miniaturization and attention is now paid to the new technique for realizing single gate structure as the gate structure.

In the case of such single gate type non-volatile memory, a material that can store charges, for example, a material of nitride film group is employed as a gate insulation film covered between a silicon substrate and a gate electrode and thereby charges may be stored by seizing the charges with the gate insulation film that can store charges in place of using a floating gate. As an example of a single gate type non-volatile semiconductor memory, a SONOS type memory has been proposed. This SONOS type memory has the laminated structure of silicon oxide film (SiO), silicon nitride film (SiN) and silicon oxide film (SiO) as a structure of gate insulation film and data recording can be realized by inputting or outputting the charges to or from the silicon nitride film (SiN). (The silicon oxide film (SiO) nearer to the silicon substrate is called the first gate oxide film and that nearer to the gate electrode is called the second gate oxide film.)

For such SONOS type memory cell, a cell layout in which the source and drain are connected in parallel is generally employed. In this layout, the sources and drains of a plurality of adjacent memory cells are connected in parallel to form the columns and a column is defined as a bit line. The bit line is connected to a sense amplifier via the selection gate. The gates of the adjacent memory cells in the column direction are coupled with a single wire as the word line.

Operations of the non-volatile semiconductor memory of such SONOS type memory cell are as follows.

[Data Write Operation]

Data write operation is performed by applying the write potential Vdp (about 5V) to the bit line connected to the drain of the selected cell, giving 0V to the bit line connected to the source and applying a word line Vwp (about 10V) to the word line. In this case, the bit line and word line of non-selected cell are floated to avoid the data writing. When the data write operation is performed as explained above, hot electrons are generated at the area near the drain in the selected cell. The hot electrons are trapped into the nitride film near to the drain, exceeding the barrier of the first gate oxide film. Thereby, a threshold voltage of the selected cell shifts in the positive direction. This condition is defined as "0".

[Data Erase Operation]

The data erase operation is performed for all memory cells of the selected block by applying Vwe (about −3V) to all word lines of the selected block and setting all bit lines to Vbe (about 7V). Thereby, electrons trapped in the nitride film are removed and the threshold voltage is shifted in the negative direction. This condition is defined as "1".

[Data Read Operation]

The data read operation is performed by applying Vwr (about 4V) to the word line connected to the selected memory cell, applying a read potential Vbr (about 1V) to the bit line connected to the drain and giving 0V to the bit line connected to the source. However, the relationship between the drain and source during the read operation is inverted from the relationship in the data write operation, because electrons are trapped at the area near the diffused layer defined as the drain at the time of data write operation. Namely, a larger shift of threshold value can be obtained when the drain and source are inverted. Data read is determined with the absolute value of a current flowing into the selected memory cell.

[Data Verifying Operation]

In the case of data verifying operation, after completion of the write operation explained above, the verifying operation is performed to confirm whether write operation is sufficient or not. If write operation is insufficient, re-writing is performed to such cell. The verifying operation and write operation are repeated until all data are written. In the case of erasing the verifying operation, the verifying operation is performed after the erase operation explained above. If erase is insufficient, the erase operation is executed again. These operations are performed until the erase operation is conducted sufficiently.

The SONOS type memory cell has a characteristic, unlike the floating gate type memory cell, to trap the electrons to the insulation film. Density of trapped charges is approximated as about $2.0 \times 10^{12} cm^{-2}$ to $1.0 \times 10^{13} cm^{-2}$. This density is near to the interface level density at the interface of the substrate and first oxide film when the memory cell is deteriorated. Therefore, density of trap site in the SONOS type memory cell or at the interface with the substrate can be compared with the trap site in the nitride film and therefore gives a large influence on the transistor characteristic. When the write/erase characteristic explained above is repeated, the first gate oxide film and interface are deteriorated and an extra trap site is increased. Namely, here rises a problem that while operation is continued, the memory cell characteristic, particularly the read characteristic is deviated from the initial characteristic.

This problem is not limited to the SONOS type memory cell but is true to all memory cells in which an insulation film that can easily capture the electrons more than the silicon oxide film is formed on a gate oxide film and this insulation film is used as the electron trap.

SUMMARY OF THE INVENTION

As explained above, in the SONOS type non-volatile memory cell of the related art and also in the memory cell of the type to trap charges with a gate insulation film, extra trap site increases at the first gate oxide film and the interface thereof, and the memory cell read characteristic is thereby extremely deteriorated. Such problems have been appeared.

Referring to FIG. 1

FIG. 1 is a graph (No. 1) showing the read characteristic of the SONOS type non-volatile memory of the related art, indicating, on the same graph for the purpose of comparison, the characteristic (white square points) in the condition to start the application (initial condition) and the operation ("cycling" operation) to repeat the data write and erase operations for 10,000 times (black circular points) wherein the gate voltage (vg) is plotted on the horizontal axis and the drain current (Id) on the vertical axis. As will be apparent from FIG. 1, in the initial condition, when the gate voltage (Vg) is raised, the drain current (Id) responds sharply at a certain area and the response characteristic called "Cut-Off characteristic" can be assumed. However, after the cyclic operations of 10,000 times, such sharp cut-off characteristic is clearly deteriorated. Namely, after the cyclic operations of 10,000 times, the drain current (Id) only rises gradually and does not rise sharply from a constant value of the gate voltage (vg) even if a gate voltage (vg) rises.

Referring to FIG. 2

FIG. 2 is a graph (No. 2) indicating the read characteristic of the SONOS type non-volatile memory of the related art. As likely as shown in the FIG. 1, a gate voltage is plotted on the horizontal axis, while a drain current on the vertical axis and the characteristic (indicated with a solid line) in the condition (deterioration) before the start of use and the characteristic (indicated with a chain line) after the cyclic operations of 10,000 times are compared schematically on the same graph. Deterioration of the cut-off characteristic becomes a cause, as illustrated in FIG. 2, of completion of verification even if storage of charges is insufficient during the verify read operation. Namely, when the sharp cut-off characteristic similar to that before deterioration is obtained for a constant value of drain voltage (reference current), the adequate gate voltage not reaching the write level can be detected but after the cut-off characteristic is deteriorated, if the value of gate voltage does not reach the write level for the reference current value of the drain current, it is erroneously assumed that such gate voltage has reached the write level.

However, it has been known that deterioration of the cut-off characteristic can be recovered through the heat treatment.

Referring to FIG. 3

FIG. 3 is a graph (No. 3) indicating the read characteristic of the SONOS type non-volatile memory of the related art. Similar to FIG. 1 and FIG. 2, a gate voltage (Vg) is plotted on the horizontal axis, while a drain current (Id) on the vertical axis. Here, the characteristic before the heat treatment (solid line and white angular points in the figure) and the characteristic after the heat treatment (dotted line and black angular points in the figure) are indicated on the same graph for comparison. From FIG. 3, it can be understood that the cut-off characteristic may be improved with the heat treatment. Namely, even when the drain current (Id) shows only gradual change for change of gate voltage (Vg) through the cyclic operations of considerable number of times before the heat treatment and the cut-off characteristic is sufficiently deteriorated, the graph is curved at the constant value of the gate voltage (Vg) after the heat treatment, and thereby it will be understood that the good cut-off characteristic in which the drain current (Id) quickly responds is recovered.

The fact indicated with the experiment that the cut-off characteristic is improved with the heat treatment as explained above means that the threshold value after the verify write operation shifts in the negative direction due to the thermal stress and thereby the window margin of the erase condition and write condition becomes narrow. Namely, deterioration in the cut-off characteristic will result in the problem, namely, deterioration of retention.

As explained above, it has been proved that the related art has the problems that it is impossible to accurately verify whether the data has been written accurately or not and that the data retention characteristic is deteriorated. Therefore, the present invention has been proposed to solve the problems explained above, reserve the accurate data verify and good data retention as the characteristic and always provide the equal and good read characteristic even when the first gate oxide film and interface are deteriorated due to the device operations such as data write and erase operations.

The present invention is intended to solve the problems explained above, for example, with the following means.

(1) A non-volatile semiconductor memory device (EEPROM) including a memory cell array arranging a plurality of memory cells, enabling electrical reprogramming through the transfer of charges between a charge trap layer and a semiconductor substrate, in the form of matrix, each of such cells is formed by sequentially laminating, on the semiconductor substrate, a first gate oxide film, the charge trap layer consisting of an insulation material which traps charges more easily than a silicon oxide film, a gate insulation film consisting of a second gate oxide film and a gate electrode, wherein after data is written to the memory cell, electrons are partly removed from the charge trap layer.

(2) A non-volatile semiconductor memory device as described in item (1), comprising, under the condition of $0 \leq |Vws| \leq |Vwe|$, $0 \leq |Vbs| \leq |Vbe|$, $ts \leq te$:

a means for writing data to the memory cells by applying voltages Vwp to the gate electrode and Vdp to the drain of the memory cells, a means for erasing data from the memory cells by applying for te seconds the erase voltages Vwe to the gate insulation film and Vbe to the source and drain of the memory cells, and a means for removing a part of the electrons by applying for ts seconds the voltage Vwe to the gate insulation film and the voltage Vbs to the source and drain after the data writing operation.

(3) A non-volatile semiconductor memory device as described in item (2), wherein a part of electrons is removed under the voltage condition of Vbs=Vdp.

(4) A non-volatile semiconductor memory device as described in items (1) to (3), wherein after data is written to the memory cell array on the occasion of executing the verify write operation, a part of the electrons is removed and verify operation is performed and such operations are repeated until the data is written sufficiently.

(5) A data holding method of a non-volatile semiconductor memory device for applying, for a short period of time, a voltage equal to the voltage to erase the data stored in the memory cell, in order to remove a part of the electrons, to the a non-volatile semiconductor memory device (EEPROM) including a memory cell array arranging a plurality of memory cells, enabling electrical reprogramming through the transfer of charges between a charge trap layer and a semiconductor substrate, in the form of matrix, each of such cells is formed by sequentially laminating, on the semiconductor substrate, a first gate oxide film, the charge trap layer consisting of an insulation material which traps charges more easily than a silicon oxide film, a gate insulation film consisting of a second gate oxide film and a gate electrode.

(6) A data holding method of the non-volatile semiconductor memory device as described in item (5), comprising, under the condition of $0 \leq |Vws| \leq |Vwe|$, $0 \leq |Vbs| \leq |Vbe|$, $ts \leq te$:

a means for writing data to the memory cells by applying voltages Vwp to the gate electrode and Vdp to the drain of the memory cells, a means for erasing data from the memory cells by applying for te seconds the erase voltages Vwe to the gate insulation film and Vbe to the source and drain of the memory cells, and a means for removing a part of the electrons by applying for ts seconds the voltage Vwe to the gate insulation film and the voltage Vbs to the source and drain after the data writing operation.

(7) A data holding method of the non-volatile semiconductor memory device as described in item (6), wherein a part of electrons is removed under the voltage condition of Vbs=Vdp.

(8) A data holding method of the non-volatile semiconductor memory device as described in items (5) to (7), wherein after data is written to said memory cell array on the occasion of executing data verify operation, a part of the electrons is removed and verify operation is performed and such operations are repeated until the data is written sufficiently.

Next, operations of the present invention will be explained. The characteristics of the present invention may be summarized as follows. After the data write operation of a non-volatile semiconductor memory (EEPROM) using a charge storing insulation film in place of a gate insulation film in the related art, a potential corresponding to application to a memory cell in order to data erase is given, for example, to the memory cell for only a moment and thereby the read characteristic can be improved. Effect of such improvement in the read characteristic is peculiar to the non-volatile semiconductor memory (EEPROM) using the charge storing insulation film in place of the gate insulation film of the related art and the similar improvement in the read characteristic cannot be attained even when the operation to give the pulse corresponding to the data erase potential to the memory cell after data write operation is conducted for the EEPROM of the related art. Namely, the finding of improvement in the read characteristic of the present invention is sufficiently considered as the novel finding attained after investigations by the inventors of the present invention but the principle thereof is not yet sufficiently proved.

Referring Again to FIG. 1

As illustrated in FIG. 1, in the memory cell, like the SONOS type memory cell, where an insulation film that can trap electrons more easily than a silicon oxide film is provided on a gate oxide film and it is then used as the electron trap, it has been confirmed by experiment that deterioration at the interface gives a large influence on the read characteristic of the memory cell. However, it is also confirmed by experiment that the read characteristic can be improved by conducting, although identical to the data erase operation, the stress operation (called the "post write operation") composed of the gate voltage which is alleviated in comparison with the data erase operation or drain voltage or extremely shortened application pulse width after the data write operation.

Referring to FIG. 4

FIG. 4 illustrates a graph (No. 1) indicating the read characteristic of the SONOS type non-volatile memory of the present invention. In the FIG. 4, a gate voltage (Vg) is plotted on the horizontal axis and a drain current (Id) on the vertical axis. The initial condition, namely condition before start of use is indicted with a dotted line, the condition after data write with a fine solid line and the condition after the soft erase, i.e., after inputting the post write pulse, with a thick solid line. As illustrated in FIG. 4, it can be understood that the sharp cut-off characteristic in the condition before start of use (initial condition) is deteriorated by aging through the update of data and response of the drain current (Id) for increase of the gate voltage (Vg) is very much deteriorated but the read characteristic is improved because the post write pulse in the present invention is inputted after the data write operation.

As explained above, it has been proved by the experiment that when the post write pulse is inputted after application of the pulse for data write operation in order to realize the data write operation, the read characteristic is improved. It has not yet been clearly found that the reason. why the post write pulse is effective for reliable holding of the stored data. Instead, the significant effect of the post write pulse has been recognized as a result of the inventors' several experiments.

By the way, the sufficient effect cannot be obtained if such post-write pulse is given for the longer time. If the post-write operation pulse is given for a longer period, electrons injected to the nitride film for the data writing are pulled out and the threshold voltage is shifted in the negative direction. Therefore, the pulse for post-write operation must be shorter than the pulse for erase operation. It has also been proved by the experiment and the reason will be explained with reference to FIG. 5.

Referring to FIG. 5

FIG. 5 is a graph indicating the threshold value characteristic of the SONOS type non-volatile memory of the present invention. In FIG. 5, the time for giving an erase potential to the memory cell after data write (pulse length: ts) is plotted on the horizontal axis, while a threshold value potential (V) and S coefficient (mV/dec) on the vertical axis to show the relationship between these values. Change of the threshold voltage (V) for pulse length ts (sec) is indicated by the graph connecting the write points. Meanwhile, change of S coefficient (mV/dec) for the pulse length ts (sec) is indicated by the graph connecting the black points. Voltage condition of the pulse given to the memory cell after data write (hereinafter referred to as "post-write pulse") is not always required to be identical to the voltage condition to be given to the memory cell at the time of data erase operation and the potential which pulls out the charges to the substrate from the charge storage film of the memory cell will provide sufficient effect of the present invention even if the voltage condition is different. However, when the voltage condition of post-write pulse is identical to the voltage condition at the time of data erase, only the time control for the pulse is basically required and therefore it is preferable because the effect that the circuit structure is simplified can be obtained as an accompanying effect. Therefore, when the voltage condition of post-write pulse is identical to that at the time of erase operation, it is explained as a first example. When $ts<1\times10^{-6}$ sec=ts0 from FIG. 5, it can be understood that the threshold voltage does not return to the initial condition but the S coefficient is recovered. Accordingly, when the voltage condition of the post-write operation is set identical to that of the erase operation, ts<ts0 is the preferable condition. ts0 is equal to 1/10000 of the ordinary erase time te.

Here, the post-write pulse means for improving only the read characteristic without pulling out the electrons injected to the nitride film as positively as erasing the data can also be realized by alleviating the gate voltage or the drain voltage of the memory cell in comparison with the voltage in the erase operation, in addition to adjustment of the pulse width to the short period in the same manner as the voltage relationship during the data erase operation. Namely, when the word line voltage for the post-write pulse is defined as Vws, the bit line voltage as Vbs, the word line voltage Vwe in the erase operation and the bit line voltage as Vbe, only the read characteristic can be improved without pulling out the electrons injected to the nitride film as positively as erasing the data by setting stress condition of the post-write operation as satisfying the relationships such as $|Vws|<|Vwe|, |Vbs|<|Vbe|$.

In more practical, when the post-write pulse is added after the data writing, the all bit lines of the selected memory cell block are set to Vbs and Vws is applied to all word lines. In this case, the p-type substrate (or p-type well and n-type substrate) formed on this memory cell block is grounded. Thereby, the excellent and constant read characteristic of the memory cell can be obtained.

Effect of the Invention

As explained above, the present invention provides the effect that the write data holding characteristic of the electrically erasable/programmable non-volatile memory (EEPROM) can be improved substantially without change of manufacturing process of the memory cell array. Moreover, it is also possible to obtain similar effect even by giving a potential similar to the erase potential and shortening only the pulse length, together with the accompanying effect in the present invention that generation of pulse can be controlled at the outside of the EEPROM without requiring, in this case, a new provision of the voltage boosting circuit or the like for such object.

Moreover, in the present invention, it is no longer required to self-completely execute the control by conducting the timing control using external clock such as CPU clock or the like. Therefore, following additional effects can also be attained that the peripheral circuits in the EEPROM can be simplified and general purpose EEPROM can be used in direct.

BRIEF DESCRIPTION OF THE DRAWINGS

FIG. 5: Graph indicating change of erase time from the write condition, threshold value potential and S coefficient of the memory cell.

FIG. 8: Cross-sectional view of essential portion of the memory cell array (diagram illustrating the cross-sectional views along the line A–A' and B–B' of FIG. 6)

FIG. 9: Diagram illustrating an example of the program sequence adding the post-write operation.

FIG. 12: Diagram illustrating an example of the oscillation circuit and the sequence thereof.

FIG. 14: Diagram illustrating an example of the bit line voltage generating circuit and the sequence thereof.

DESCRIPTION OF THE REFERENCE NUMBERED ELEMENTS

11 . . . Word line (control gate);
12 . . . Bit line (n-type diffused layer);
13 . . . Element isolation oxide film;
14 . . . p-type substrate (or p-type well and n-type substrate);
15 . . . First gate oxide film;
16 . . . Nitride film;
17 . . . Second gate oxide film;

DETAILED DESCRIPTION

Reference is now made in detail to specific embodiments of the present invention that illustrates the best mode presently contemplated by the inventors for practicing the invention.

Figure 1:
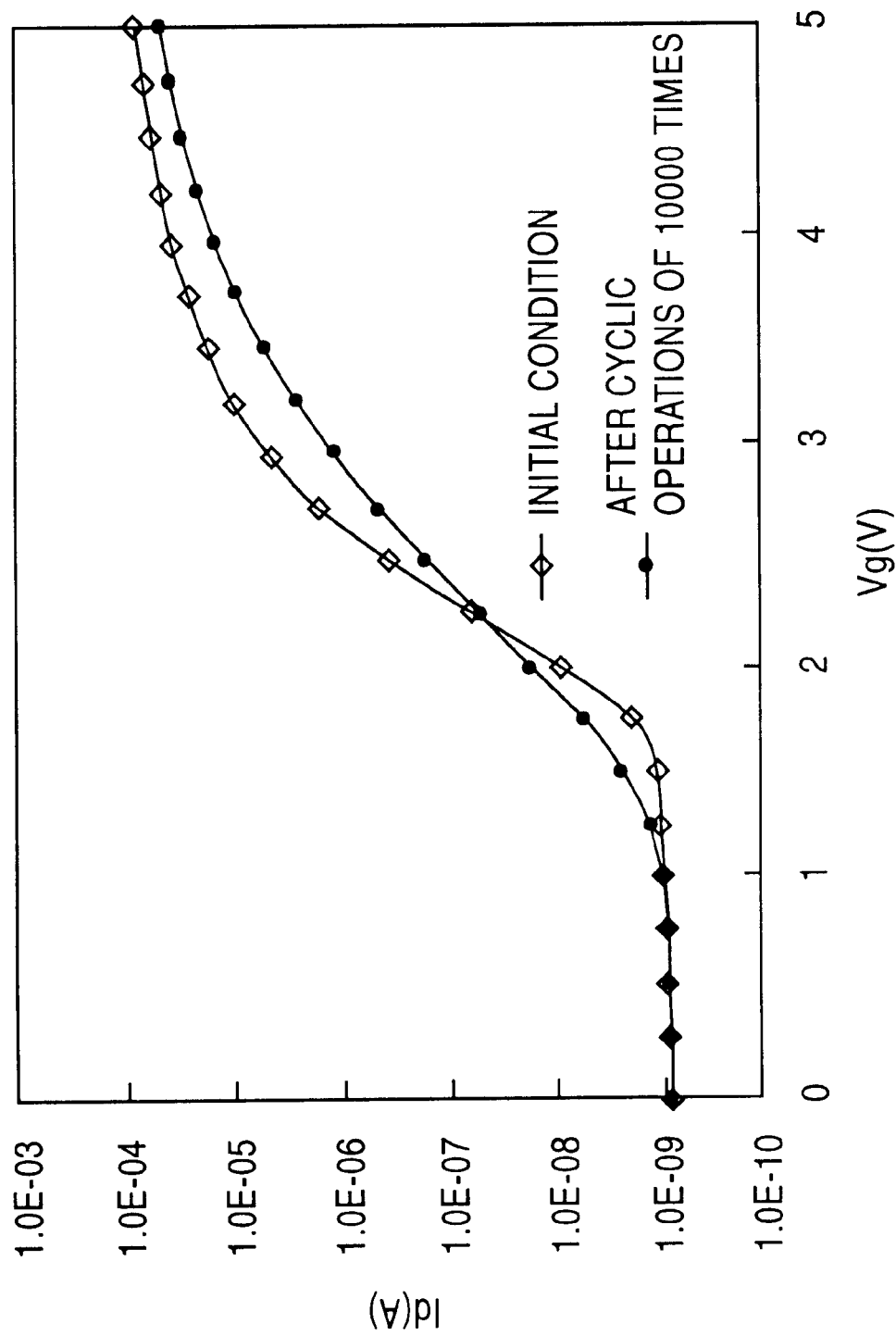
FIG. 1: Graph (No.1) illustrating the read characteristic of the SONOS type non-volatile memory of the related art.
Figure 2:
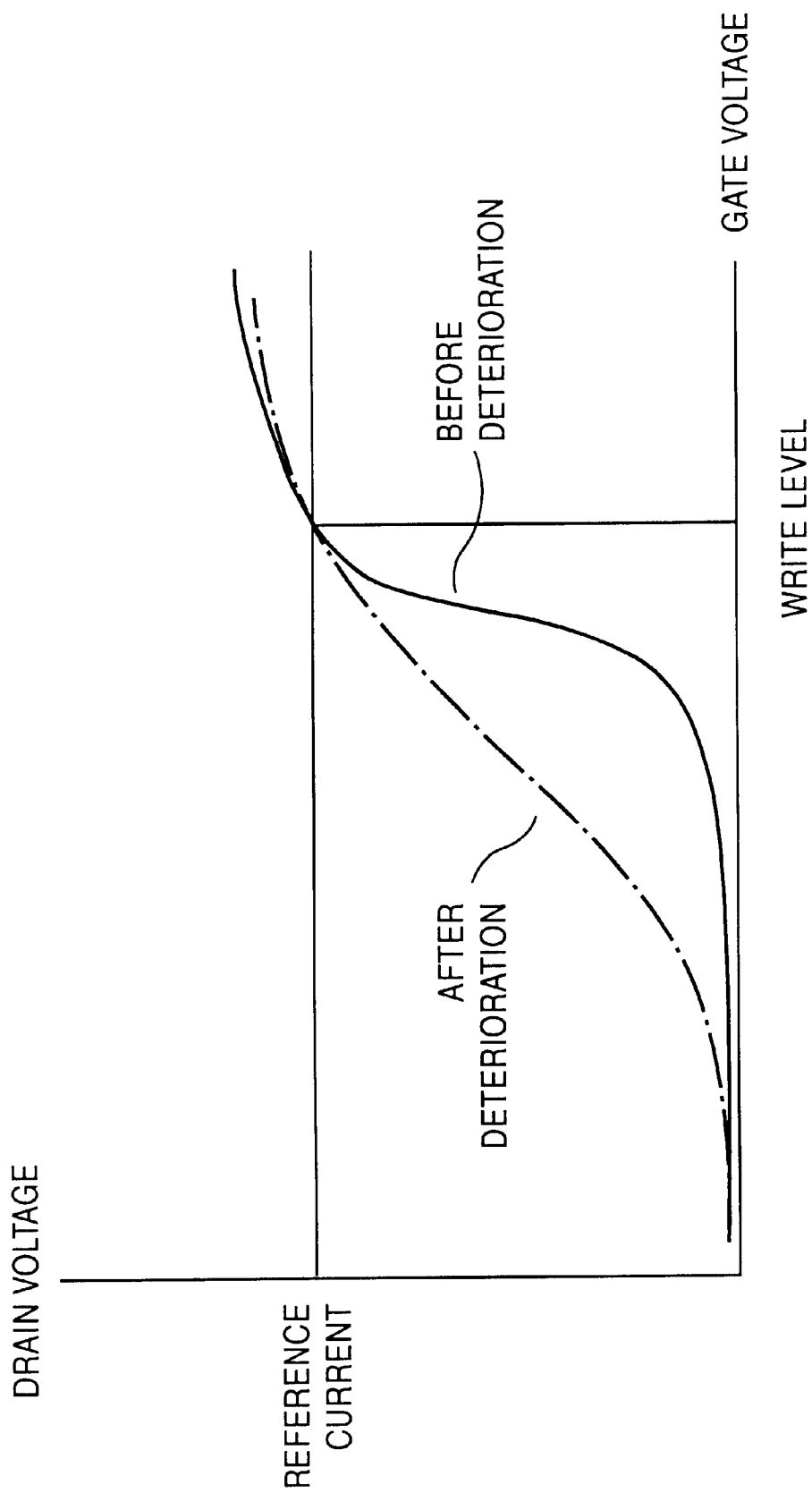
FIG. 2: Graph (No.2) illustrating the read characteristic of the SONOS type non-volatile memory of the related art.
Figure 3:
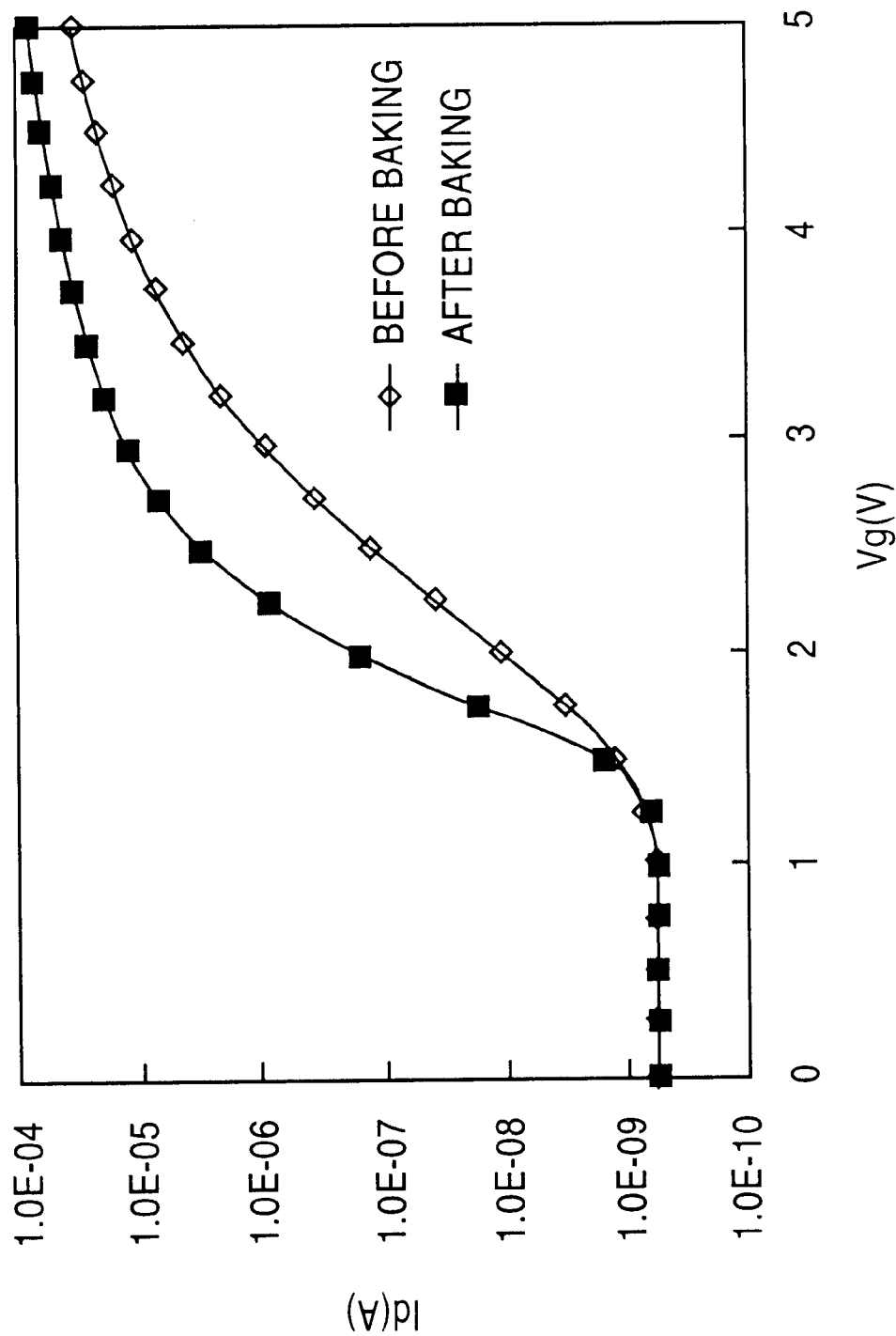
FIG. 3: Graph (No.3) illustrating the read characteristic of the SONOS type non-volatile memory of the related art.
Figure 4:
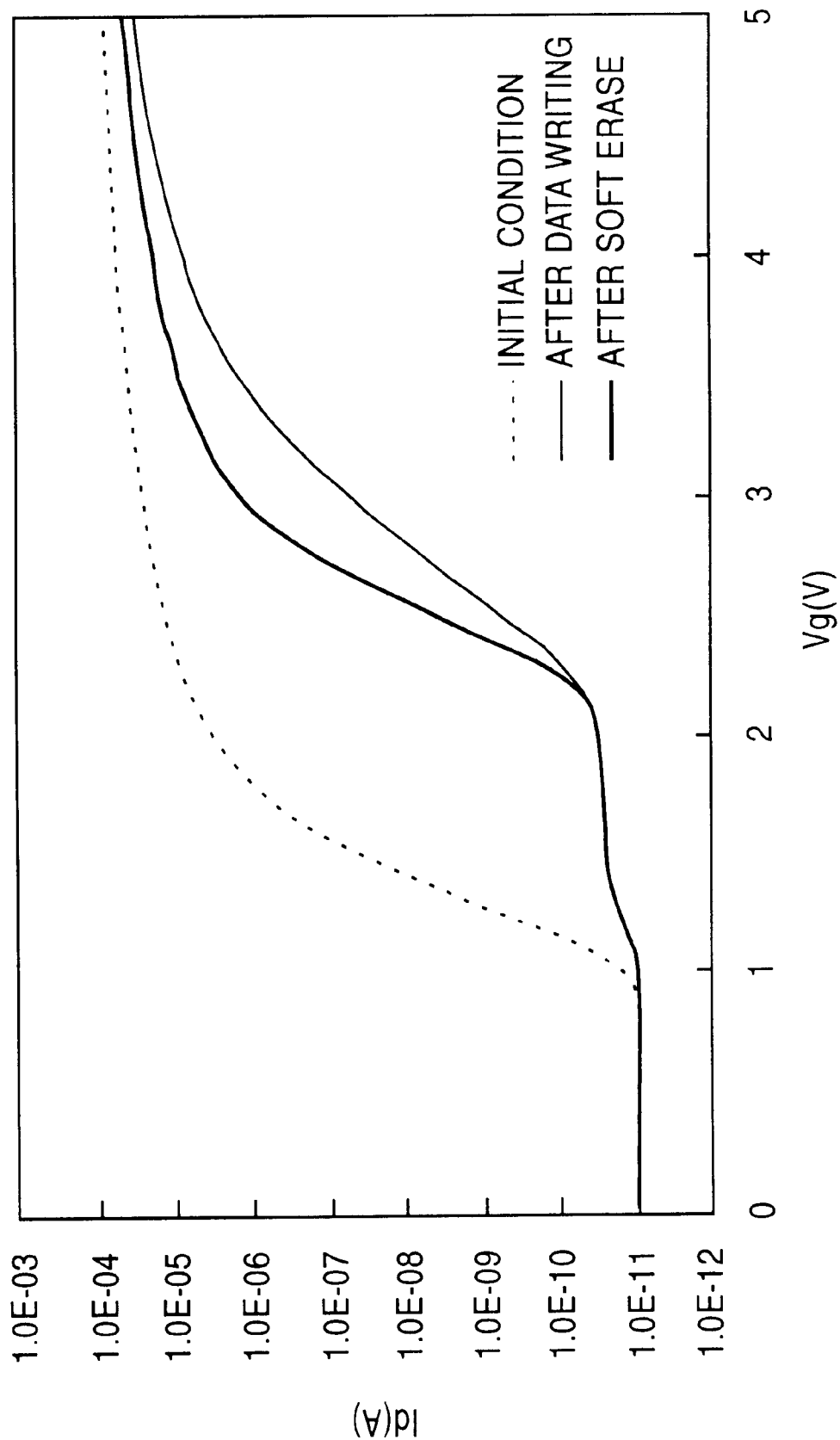
FIG. 4: Characteristic diagram illustrating improvement of read characteristic through the post-write operation.
Figure 7:
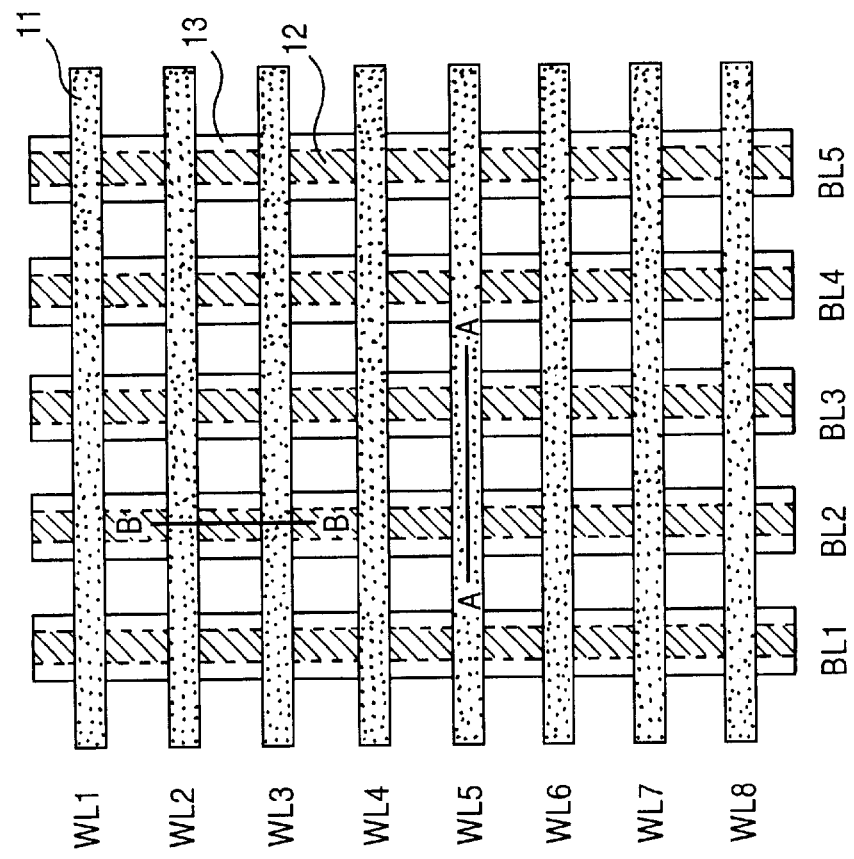
FIG. 7: Equivalent circuit diagram of the memory cell array (diagram illustrating an equivalent memory cell array corresponding to FIG. 6)
Figure 6:
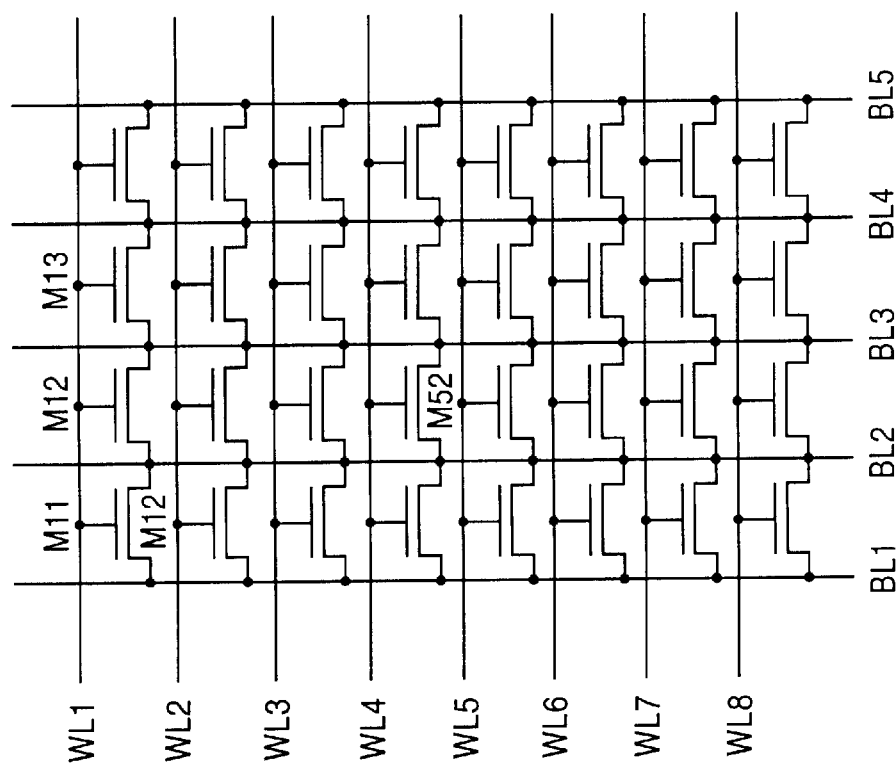
FIG. 6: Schematic plan view of the memory cell array.

[First Embodiment]
Referring to FIGS. 6 through 8

FIG. 6 is a schematic plan view of a memory cell array of the non-volatile memory based on an embodiment of the present invention. FIG. 7 is an equivalent circuit of the non-volatile memory based on a preferred embodiment of the present invention, which is corresponding to the memory cell array as illustrated in FIG. 6. FIGS. 8(a) and 8(b) are cross-sectional views of the memory cell array of the non-volatile memory based on the preferred embodiment of the invention (FIG. 8(a) is the cross-sectional view along the line A–A', while FIG. 8(b) is the cross-sectional view along the line B–B').

In FIG. 6, the sources and drains of eight memory cells are connected in parallel in the row direction, while the gate electrodes of the adjacent memory cells are connected in the column direction. Here, attention is paid to only one memory cell for the explanation. According to FIG. 8, a memory cell is structured by forming a gate electrode 11 via the laminated gate insulation film that is formed of a first gate oxide film 15 formed on the p-type substrate 14, a nitride film 16 formed on a first gate oxide film and a second gate oxide film 17 formed on such nitride film. The n-type diffused layers 12 as the source and drain of these memory cells are formed in common in the column direction according to FIG. 6. As illustrated in FIG. 8, the source and drain have the identical structure and are in the line symmetrical relationship about the gate located at the center. Moreover, according to FIG. 8, the memory cell is isolated in the element from the memory cell adjacent in the row direction with the element isolation oxide film 13. Simultaneously, the element isolation oxide film insulates between the source and drain from the gate electrode. Here, the memory cell manufacturing process depicted as the cross-sectional views in FIG. 8 is as follow. First, after the first gate oxide film 15 is formed in the thickness of 7 nm with the wet oxidation on the p-type substrate 14, the SIN film 16 is grown in the thickness of 5 nm by the CVD method, and the second gate oxide film 17 is formed in the thickness of 10 nm with the wet oxidation method. Thereby, the ONO film is formed. Next, the area that will become the gate is masked with a photoresist and the ONO film in the area, which will become the source and drain is removed with the etching. Under this condition, as is injected vertically to the substrate to form a diffused layer 12. Moreover, B is obliquely injected for diffusion thereof in both sides of the diffused layer 12. After removing the photoresist, field oxidation is performed to form the element isolation oxide film 13. Here, thickness of the element isolation oxide film 13 is set to 50 nm. The memory cell is formed as explained above.

As illustrated in FIG. 6, the column of the diffused layer formed by connecting the source and drain of memory cell in the row direction becomes the bit line. The bit line is connected with a sense amplifier via the selected gate. Moreover, according to FIG. 6, the gate electrode of memory cell is simultaneously formed with the gate electrodes of the adjacent memory cells by means of the conductive layers arranged in the column direction to form the word lines. The outline of the memory cell array of the non-volatile memory to which the present invention is applied has been explained above.

Next, operations of the non-volatile memory (EEPROM) including the memory cell structured as explained above will then be explained. Referring to FIGS. 7 and 8:

[Data Erase Operation of Memory cell]

First, the memory cell array block is selected to write the data. For the selected blocks, the data of all memory cells of such block is erased prior to the data write operation. When data is to be erased, a voltage of 7.0(V) is applied to the bit lines of all selected blocks. Next, a voltage of −3.0(V) is applied to the word lines of all selected blocks. Electrons are removed from the nitride film in all memory cells of selected blocks and the threshold value is maintained at the low level "1" by keeping this bias condition to about 10 msec.

[Data Write Operation to Memory Cell]

Next, the data write operation is carried out. Data can be written to the selected blocks by setting the bit line connected to the drain of selected memory cell to 5.2(V) and the bit line connected to the source to 0(V) and applying 9.5(V) to the word line of selected memory cell. In this case, the bit line connected to the source and drain of the non-selected memory cell is floated. However, in regard to the memory cells using in common the bit lines with the selected memory cell, single side of bit line is set to 5.2(V) or to 0(V). If the data write is performed during the operation explained above, electrons are injected to the nitride film at the area near the diffused layer that will become the drain of selected memory sell and the threshold value becomes high "0". Moreover, data write operation is not performed to the non-selected memory cells.

[Post-write Pulse Application to Memory Cell)]

Next, the post-write pulse operation will be performed. The post-write pulse operation can be executed to the selected blocks by applying the potential of 7.0(V) to all bit lines of the selected blocks. Next, the potential of −3.0(V) is applied to all word lines of the selected blocks. This bias condition is maintained for about 3μsec. Thereby, the reading characteristic of all memory cells of the selected blocks can be improved.

Referring to Table 1

Table 1 illustrates an example wherein data is written in the memory cell M52 in FIG. 7 and also illustrates the relationship of the potential applied to the memory cell array in each operation explained above.

TABLE 1

|  |  | Erase | Write | Read | Soft-erase |
|---|---|---|---|---|---|
| Word-line | WL1 | −3.0 (V) | Floating | Floating | −3.0 (V) |
|  | WL2 | −3.0 (V) | Floating | Floating | −3.0 (V) |
|  | WL3 | −3.0 (V) | Floating | Floating | −3.0 (V) |
|  | WL4 | −3.0 (V) | Floating | Floating | −3.0 (V) |
|  | WL5 | −3.0 (V) | 9.5 (V) | 4.0 (V) | −3.0 (V) |
|  | WL6 | −3.0 (V) | Floating | Floating | −3.0 (V) |
|  | WL7 | −3.0 (V) | Floating | Floating | −3.0 (V) |
|  | WL8 | −3.0 (V) | Floating | Floating | −3.0 (V) |
| Bit-line | BL1 | 7.0 (V) | Floating | Floating | 7.0 (V) |
|  | BL2 | 7.0 (V) | 5.2 (V) | 0 (V) | 7.0 (V) |
|  | BL3 | 7.0 (V) | 0 (V) | 1.6 (V) | 7.0 (V) |
|  | BL4 | 7.0 (V) | Floating | Floating | 7.0 (V) |
|  | BL5 | 7.0 (V) | Floating | Floating | 7.0 (V) |
| Substrate |  | Ground | Ground | Ground | Ground |

Next, the operation sequence of the non-volatile memory at the time of applying the post-write pulse will be explained with reference to FIG. 9.

Reference to FIG. 9

FIG. 9 illustrates the operation sequence in which change with time of each potential of the gate (=word line), drain and source of the memory cell when the post-write pulse is applied is indicated. As illustrated in the figure, each potential of the gate (=word line), drain and source becomes H level (=Vwp(V)) at the gate (=word line) and drain first before application of the post-write pulse and thereby the data is written to the memory cell. Subsequently, at the time ts (sec), the gate voltage falls to the minus potential Vws (V) and the drain voltage rises to the positive potential Vds(V). Thereby, the post-write pulse is applied to the memory cell.

Referring to FIG. 11 to FIG. 15

Next, the circuit for realizing application of post-write pulse following the data write operation and operation of such circuit will be explained with reference to the embodiment thereof.

Figure 11:
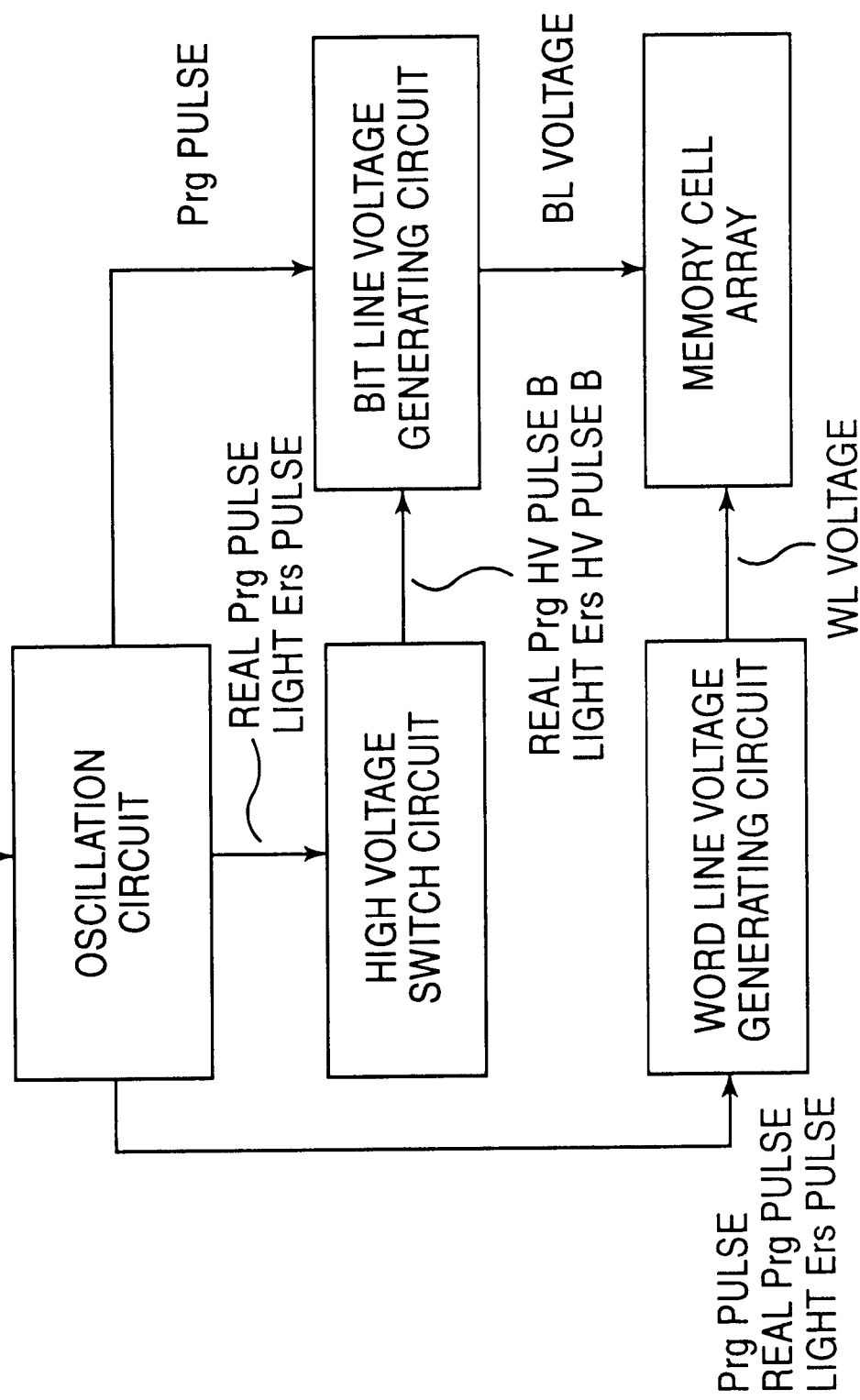
FIG. 11: Diagram illustrating an example of a circuit structure for realizing the post-write operation.

FIG. 11 is a block diagram illustrating a circuit structure of the EEPROM conforming to the first embodiment of the present invention. In FIG. 11, the address buffer for address selection and address decoders of rows and columns are omitted and only the structure of the part in relation to the write and post-write operations will be illustrated.

Figure 13A:
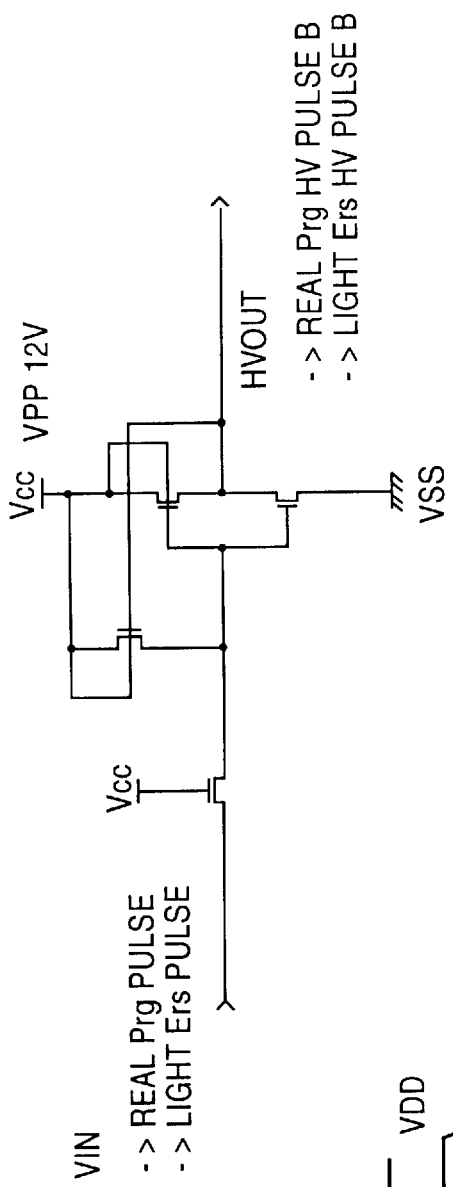
FIG. 13: Diagram illustrating an example of the high voltage switch circuit and the sequence thereof.
Figure 13B:
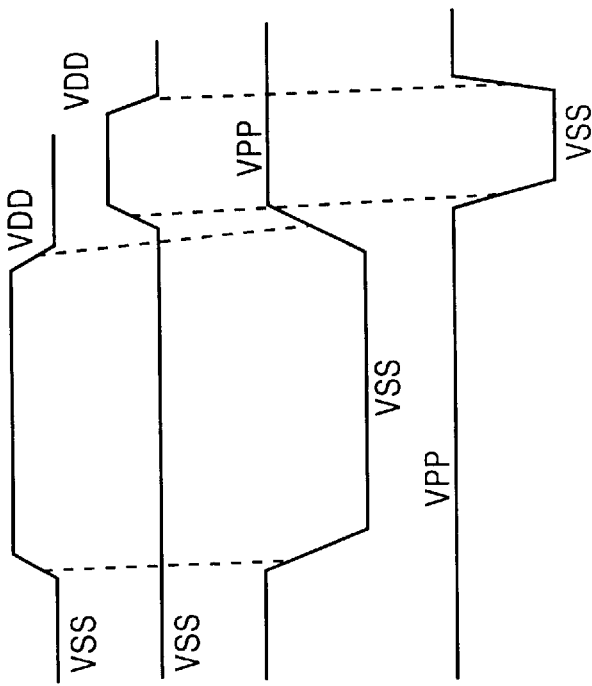
Figure 15A:
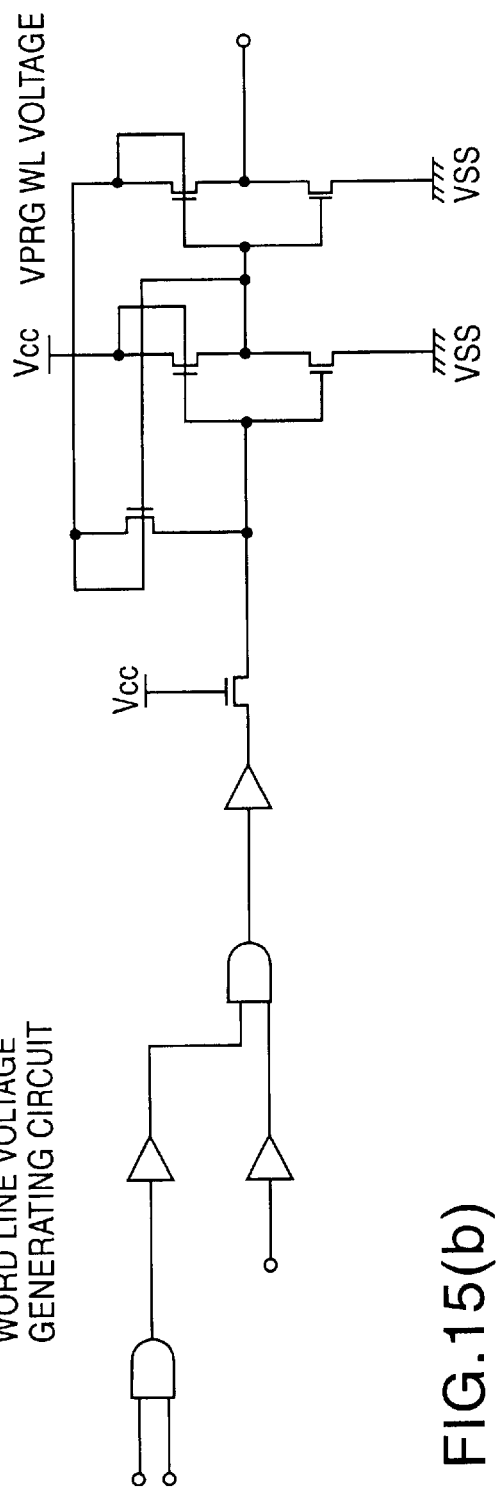
FIG. 15: Diagram illustrating an example of the word line voltage generating circuit and the sequence thereof.
Figure 15B:
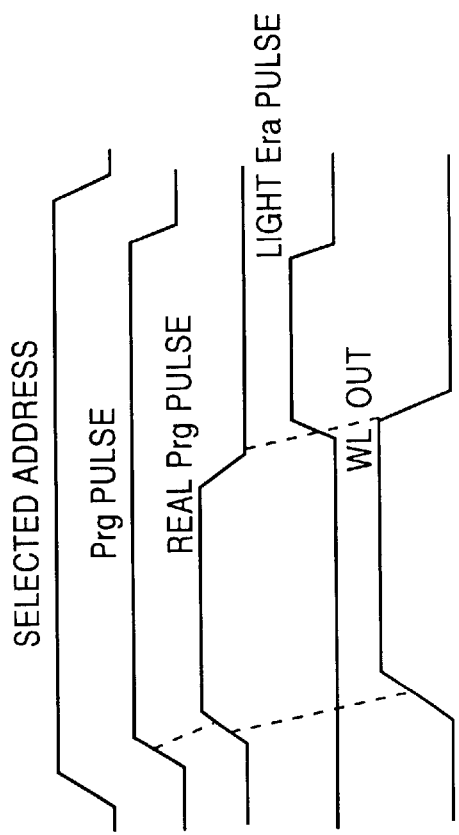

FIGS. 12(a) and 12(b) illustrate the structure (a) of the oscillation circuit of EEPROM conforming to the first embodiment of the present invention and the pulse timing diagram (b). FIGS. 13(a) and 13(b) illustrate the structure (a) of the high voltage switch of EEPROM conforming to the first embodiment of the present invention and the pulse timing diagram (b). FIGS. 14(a) and 14(b) illustrate the structure (a) of the bit line voltage generating circuit of EEPROM. conforming to the first embodiment of the present invention and the pulse timing diagram (b). FIGS. 15(a) and 15(b) illustrate the structure of the word line voltage generating circuit of EEPROM conforming the first embodiment of the present invention and the pulse timing diagram (b).

The oscillation circuit illustrated in FIG. 12(a) inputs, when the data write command is input from external circuit, oscillation of oscillator (OSC) to a counter circuit Count1 to generate a preliminary pulse (Prg Pulse) for data write operation. The pulse (Real Prg Pulse) for data write is generated with the counter circuit Count2 at the rising edge (period) of this Prg Pulse and oscillation of OSC.

Next, as illustrated in FIG. 12(b), the counter circuit Count3 will generate the pulse (Light Ers Pulse) for the post-write operation with that obtained by multiplying the rising edge (period) of Prg Pulse with delay, rising edge of Real Prg Pulse and oscillation of OSC. These Prg Pulse, Real Prg Pulse and Light Ers Pulse are defined as the HVSW and WLOUT control signals.

The high voltage switch circuit circuit (HVSW) illustrated in FIG. 13 (a) corrects the logic for controlling the voltage to be supplied to the bit line BL. The Real Prg Pulse and Light Ers Pulse are converted to the negative logic from the positive logic with HVSW. Simultaneously, the voltage is also converted and thereby the Real Prg Pulse is converted to the bit line voltage for data write operation and Light Ers Pulse is converted to the bit line voltage for bit line voltage for post-write operation. Namely, Real Prg Pulse is converted to Real Prg HV Pulse B and Light Ers Pulse is converted to Light Ers HV Pulse B with HVSW. Above conversion sequence is illustrated in FIG. 13(b).

The bit line voltage generating circuit illustrated in FIG. 14(a) is the operational amplifier type voltage generating circuit. However, the operation time is defined only by the condition where the Real Prg Pulse output from the OSC part is in the level H. As illustrated in FIG. 14 (b), the bit line voltage generating circuit generates the voltage pulse to be applied to the bit line by combining the Real Prg HV Pulse B and Light Ers HV Pulse B. The voltage pulse explained above generated with the bit line voltage generation circuit has two kinds of different amplitudes of the bit line voltage for data write operation and bit line voltage for post-write operation.

The word line voltage generating circuit illustrated in FIG. 15(a) controls the voltage to be applied to the word line, and it uses a high voltage conversion switch. With the control signals Real Prg Pulse and Light Ers Pulse in the H active condition, individual voltages are applied to the word lines. Namely, when the Real Prg Pulse is in the H level, the voltage Vwp is applied to the word line and at the time of Light Ers, the voltage Vws is impressed to the wordline. According to the structure of the word line voltage generating circuit illustrated in FIG. 15(a), the voltage Vws is set to 0(V) for simplifying the explanation. However, it is also possible to modify the circuit to provide the negative voltage Vws.

An embodiment of the present invention has been explained above, but various modifications are possible as will be explained later. For example, the similar effect can also be attained even in the case of NOR connection type or NAND connection type without relation to the connecting format of the memory cell. Moreover, any timing can be selected substantially for application of the post-write pulse to the memory cell. Namely, when the data is written to the memory cell, the post-write pulse may be applied after the data write or may be applied immediately before the data read operation. As a material of the charge trap layer, an example where the so-called ONO film attained by forming the oxide films to the upper and lower surfaces of the nitride film to sandwich the nitride film is used, but it is also possible to use the insulation material that can easily trap the charges in place of such ONO film. For example, it is also possible to use, instead of the nitride film, the $Al_2O_3$ (alumina) or $Ta_2O_5$ (tantalum pentoxide) can be applicable. Namely, the stacked layer of Silicon Oxide/$Al_2O_3$(alumina)/ Silicon Oxide or the stacked layer of Silicon Oxide/$Ta_2O_5$ (tantalum pentoxide)/Silicon Oxide can be applicable instead of ONO film. And further, ON film (a stacked film of Silicon Oxide/Silicon Nitride) also can be used instead of ONO film. Also, a stacked film of Silicon Oxide/$Ta_2O_5$ (tantalum pentoxide) or a stacked film of Silicon Oxide/ $Al_2O_3$(alumina) also can be used. Moreover, several materials can be applicable to the charge trap layer in lieu of the above-exemplified materials, if it meets all of following requirements from (a) thorough (d).

(a) Wider Band Gap

It should have broader band gap compared to silicon oxide film. Because, silicon oxide will not be able to function as barrier layer and also very high energy will be required for electron injection unless it has broader band gap.

(b) Trap Concentration

Its trap concentration should be moderately or comparatively high.

(c) Trap Level

Its trap level should be deeper compared to thermal energy at room temperature. Charge lost will be frequently occurred unless its trap level is deeper than the thermal energy.

(d) Compatibility with Silicon or Silicon Oxide

It should be easily compatible with silicon or silicon oxide simply because it should be easily deposited to form a film on silicon or silicon oxide.

The applicability of a material does not directly depend upon nature of metal element itself of the material but it can depend upon how much free bond can be included in the material. If total amount of free bond in the material is very large, then the material can be favorably applied to charge trap layer.

Moreover, although the above first embodiment illustrates regarding flash EEPROM device (Flash memory), the present invention can be applied also to a hybrid device, such as Flash memory & Logic device, or other semiconductor devices capable of Flash memory function.

[Second Embodiment]

In the above first embodiment, the post-write pulse which is similar to the potential at the time of erase operation but has the duration that is extremely similar to the level substantially not contributing to data erase operation is impressed to the non-volatile memory cell after the data write operation, but as the subsequent second embodiment, the operation when the function similar to application of the post-write pulse is added during the verification will be explained.

Relationship of the potential to be applied to the memory cell array during each operation will conform to an example of the [Table 1] cited in the [First Embodiment] explained above.

Next, the procedures for applying the post-write pulse by generating such pulse will be outlined below.

Figure 10:
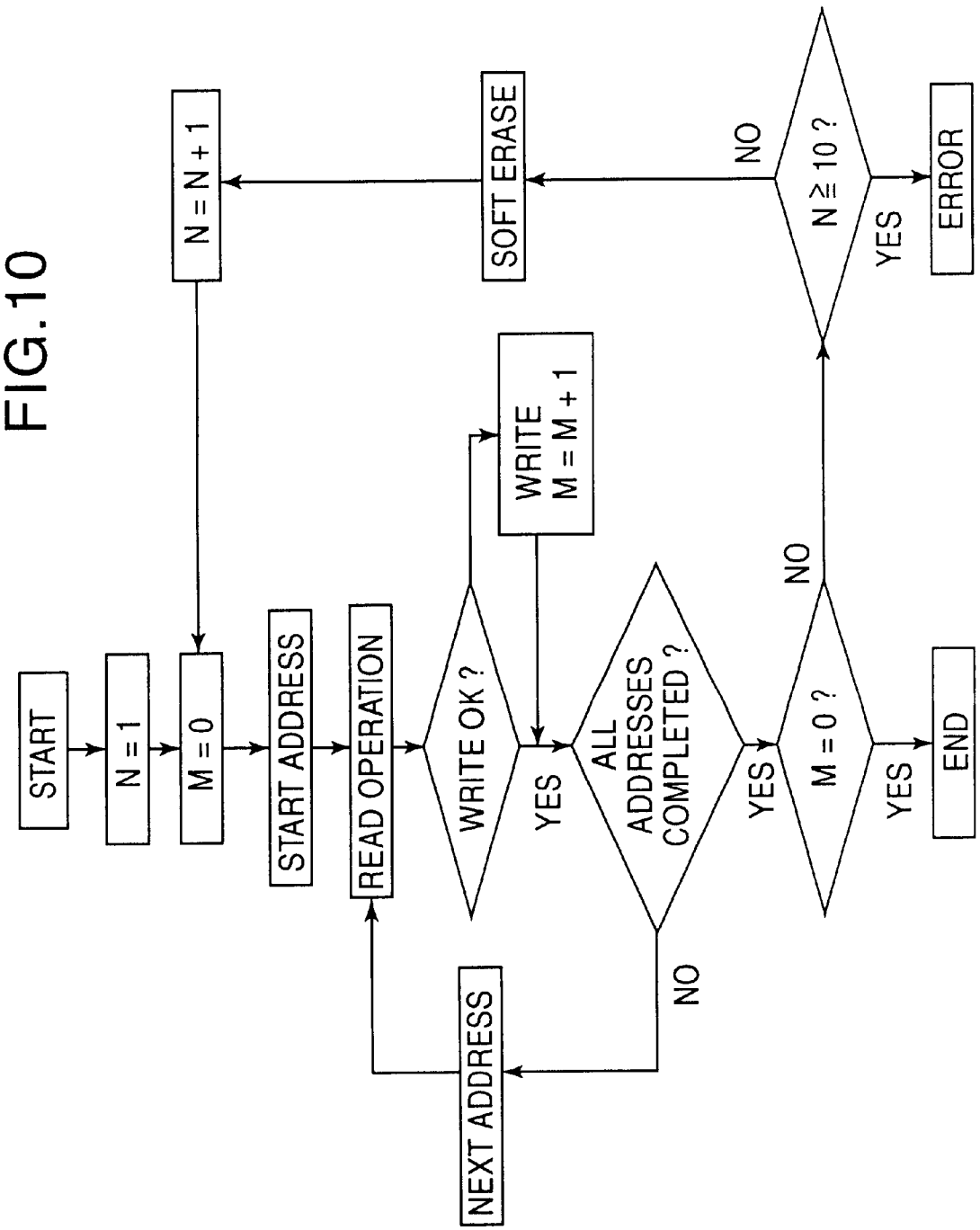
FIG. 10: Diagram illustrating an example of the write verification sequence adding the post-write operation.

Referring to FIG. 10

FIG. 10 is a diagram illustrating a program sequence conforming to the second embodiment of the present invention, indicating an example of operation sequence for verify data write operation. On the occasion of starting the data write operation first to a first memory block as illustrated in FIG. 10, the counter N for counting the number of times of data write operation and a flag M for recording whether the data is written or not as a result of verify operation are prepared and this counter N is set to 1 (N=1) for starting the data write operation. Simultaneously, since data is not yet written, the flag M is set first to 0 (M32 0). Subsequently, since verify operation is conducted sequentially from the end of the relevant memory block, the start address for the verify operation is first recognized and the data is read as a trial from the memory cell corresponding to the relevant start address to verify whether the data has actually been written or not. If data is not written normally, the data write operation is conducted and the flag M is set to 1 (M=1) When the data is written normally, the flag M is set to 0 (M=0) without re-writing of data and the write operation to the memory cell corresponding to the next address is verified. Namely, for the data read operation, the word line voltage of the selected bit is set to the write level of 4.5(V), the bit line connected to the drain is set to 1.6(V) and the bit line connected to the source is set to 0(V). However, relationship between the source and drain during the read operation is inversed from the relationship between the source and drain preset at the time of writing the bit. As explained above, the relationship between the source and drain is inverted because electrons are trapped in the area near the diffused layer which becomes the drain at the time of data write operation and when the drain and source are inverted, a larger shift of threshold value can be attained also as described in the item of [Related Art]. In this case, the substrate is grounded. A current flowing into the selected memory cell also flows into the determination circuit and is determined as level 1 when it is higher than the reference current or as level 0 when it is lower than the reference current. When shift of the threshold value is not sufficient and determined as 1 in the memory cell to which the data is written, the write operation is performed to such memory cell. Such operation is sequentially performed to all memory cells in the relevant memory cell block and when data verify to the memory cell corresponding to all addresses is completed, it is determined from the flag M whether re-write operation should be performed to any memory cell in the relevant memory block or not as a result of verify in the course of operation. When M≠0 is actually determined, it is assumed that the re-write operation is performed anywhere and in this case, a value of the counter N counting the number of times of application of the post-write pulse to the memory block is checked. When the number of times of application of the post-write pulse to the relevant memory block is too large, for example, it is 10 times or more, it is assumed as generation of error to complete the process under the assumption that recovery is impossible. If not, the post-write pulse is given to all memory cells in the relevant memory block. Thereafter, when one (1) is added to the count number N for application of the post-write pulse, the process is returned to the first routine to verify whether the normal write operation is performed attain to the same memory block or not. Outline of the process as an example of introducing the post-write pulse application operation to the data verify process has been explained above. When a series of above write operation is completed, the word line voltage reaching the reference current of the memory cell to which data is written becomes 4.5(V) or higher of the write level under the condition that the drain voltage is 1.6(V) and source voltage is 0(V).

In this embodiment, when the write command is input from the external circuit, the pulse of post-write operation has been generated automatically following the write pulse in the peripheral circuits. However, it is also possible to generate in direct the erase pulse with the external command.

Even in case that timing control of the post-write pulse will be externally performed in other circuit outside the EEPROM, it is favorable that the post-write pulse itself is generated inside the EEPROM by responding an external timing pulse but the external timing pulse is generated in such external circuit.

Referring again to FIG. 11

To realize the above signal structure, the oscillation circuit in FIG. 11 is replaced by a CPU (Central Processing Unit), which shall be located outside the EEPROM of FIG. 11.

That is to say, each of the Prg Pulse, the Real Prg Pulse, and the Light Ers Pulse is to be generated inside the CPU. In this situation, because the CPU itself commonly cannot generate high voltage signal, each of the high voltage switch circuit, the bit line voltage generating circuit, and the word line voltage generating circuit is to be generated by inside the EEPROM.

Unless following the above signal structure, an external high voltage signal should be inputted in the EEPROM circuit. However, it needs high power transistors in external circuit to generate high voltage signal, and it therefore seems not to be favorable rather than the above. However, if other circuit, which is capable of high voltage signal generation, is employed instead of the above CPU, then the post-write pulse being inputted from outside the EEPROM can be favorable applied.

What is claimed is:

1. A non-volatile semiconductor memory device (EEPROM) including a memory cell array arranging a plurality of memory cells; enabling electrical programming through the transfer, of charges between a charge trap layer and a semiconductor substrate, in the form of a matrix, each of such cells is formed by sequentially laminating, on said semiconductor substrate, a first gate oxide film, said charge trap layer consisting of an insulation material which traps charges more easily than a silicon oxide film, a gate insulation film consisting of a second gate oxide film and a gate electrode, wherein after data is written to said memory cell, post-write operation is conducted so as to add pulse bring shorter than a pulse for erase operation.

2. The non-volatile semiconductor memory device as claimed in claim 1, comprising, under the condition of $0 \leq |Vws| \leq |Vwe|$, $0 \leq |Vbs| \leq |Vbe|$, $ts \leq te$;

means for writing data to said memory cells by applying voltages Vwp to said gate electrode and Vdp to the drain of said memory cells;

means for erasing data from said memory cells by applying for te seconds the erase voltages Vwe to said gate insulation film and Vbe to the source and drain of said memory cells; and means for removing a part of the electrons by applying for ts seconds the voltage Vwe to said gate insulation film and the voltage Vbs to said source and drain after said data writing operation.

3. The non-volatile semiconductor memory device as claimed in claim 2, wherein a part of the electrons is removed under the voltage condition of Vbs=Vdp.

4. A non-volatile semiconductor memory deice as claimed in any one of claims 1 to 3, wherein after data is written to said memory cell array on the occasion of executing the data verify write operation, a part of said electrons is removed and a verify operation is performed and such operations are repeated until the data is written sufficiently.

5. A data holding method of a non-volatile semiconductor memory device for applying for a short period of time, a voltage equal to the voltage required to erase data stored in a memory cell, in order to add a pulse for post-write operation so as to be shorter than a pulse for erase operation to the non-volatile semiconductor memory device (EEPROM) including a memory cell array comprising the steps of: arranging a plurality of memory cells, enabling electrical programming through the transfer of charge between a charge trap layer and a semiconductor substrate in form of matrix, each of such cells is formed by sequentially laminating, on said semiconductor substrate, a first gate oxide film, said charge trap layer consisting of an insulation material which traps charges more easily than a silicon oxide film, a gate insulation film consisting of a second gate oxide film and a gate electrode.

6. A data holding method of the non-volatile semiconductor memory device as claimed in claim 5, further comprising the steps of, under the condition of $0 \leq |Vws| \leq |Vwe|$ and $0 \leq |Vbs| \leq |Vbe|$, $ts \leq te$:

writing data to said memory cells by applying voltages Vwp to said gate electrode and Vdp to the drain of said memory cells;

erasing data from said memory cells by applying for te seconds the erase voltages Vwe to said gate insulation film and Vbe to the source and drain of said memory cells; and removing a part of the electrons by applying for ts seconds the voltage Vwe to said gate insulation film an the voltage Vbs to said source and drain after said data writing operation.

7. The data holding method of the non-volatile semiconductor memory device as claimed in claim 6, wherein a part of electrons is removed under the voltage condition of Vbs=Vdp.

8. A data holding method of the non-volatile semiconductor memory device as claimed in any one of claims 5 to 7, wherein after data is written to said memory cell array on the occasion of executing the data verify write operation, a part of said electrons is removed and verify operation is performed and such operations are repeated until that data is written sufficiently.

9. An EEPROM, employing a memory cell having a charge trap layer capable of capturing charges easier than silicon oxide film; and being capable of writing data through an action of injecting charges into said charge trap layer, followed by an action of adding a pulse for post-write operation so as to be shorter than a pulse for erase operation.

10. The EEPROM as claimed in claim 9, wherein said charge trap layer is comprised from silicon and nitrogen.

11. The EEPROM as claimed in claim 9, wherein said charge trap layer is comprised from silicon nitride film.

12. The EEPROM as claimed in claim 9, wherein said charge trap layer is comprised from a stacked film of silicon oxide/silicon nitride.

13. The EEPROM as claimed in claim 9, wherein said charge trap layer is comprised from a staked film of Silicon Oxide/Aluminum Oxide.

14. The EEPROM as claimed in claim 9, wherein said charge trap layer is comprised from a stacked film of Silicon Oxide/Tantalum Oxide.

15. The EEPROM as claimed in any one of claims 12 through 14, wherein said charge trap layer further comprising a Silicon Oxide at its uppermost.

16. The EEPROM as claimed in claim 9, wherein said action of partially drawing said charge from said charge trap layer is performed through an action of adding a shortened pulse of the same potentials as data erase operation of said memory cell.

17. The EEPROM as claimed in claim 9, wherein said action of partially drawing said charge from said charge trap layer is automatically preceded without any external pulses after said data write operation.

18. The EEPROM as claimed in claim 9, wherein said action of partially drawing said charge from said charge trap layer is automatically preceded by a predetermined time delay after said data write operation.

19. The EEPROM as claimed in claim 9, wherein said action of partially drawing said charge from said charge trap layer is performed by a pulse, generated in a pulse generation circuit; and said pulse generation circuit is activated by inputting external signal.

20. The EEPROM as claimed in claim 9, wherein said action of partially drawing said charge from said charge trap layer is performed by a pulse, externally generated and inputted before said data write operation.

* * * * *